(12) United States Patent
Takasu

(10) Patent No.: US 7,893,497 B2
(45) Date of Patent: Feb. 22, 2011

(54) SEMICONDUCTOR DEVICE

(75) Inventor: Hiroaki Takasu, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/192,431

(22) Filed: Aug. 15, 2008

(65) Prior Publication Data
US 2009/0050969 A1    Feb. 26, 2009

(30) Foreign Application Priority Data
Aug. 23, 2007   (JP) .............................. 2007-216583

(51) Int. Cl.
*H01L 23/62* (2006.01)
(52) U.S. Cl. ..................... 257/355; 257/173; 257/356; 257/357; 257/358; 257/363; 257/E29.008; 257/E29.015; 257/E29.023; 438/155
(58) Field of Classification Search ................ 257/324, 257/355, 356, 357, 358, 359, 360, 361, 363, 257/364, E29.008, E29.015, E29.023, 351; 438/155
See application file for complete search history.

(56) References Cited

U.S. PATENT DOCUMENTS

| | | | | |
|---|---|---|---|---|
| 5,789,783 A * | 8/1998 | Choudhury et al. | ......... | 257/355 |
| 6,157,065 A * | 12/2000 | Huang et al. | ................ | 257/355 |
| 6,762,466 B2 * | 7/2004 | Huang et al. | ................ | 257/395 |
| 7,019,366 B1 * | 3/2006 | Yang et al. | ................... | 257/355 |
| 7,646,063 B1 * | 1/2010 | Boyd et al. | ................. | 257/355 |
| 2003/0112565 A1 * | 6/2003 | He et al. | ........................ | 361/56 |
| 2005/0023692 A1 * | 2/2005 | Matsunaga et al. | ......... | 257/758 |
| 2006/0001097 A1 * | 1/2006 | Nomura et al. | ............. | 257/355 |
| 2007/0034960 A1 * | 2/2007 | Zhang et al. | ................ | 257/360 |
| 2007/0069347 A1 * | 3/2007 | Lin et al. | ..................... | 257/673 |
| 2007/0080404 A1 * | 4/2007 | Fukuro et al. | ............... | 257/360 |
| 2008/0173945 A1 * | 7/2008 | Wu et al. | .................... | 257/355 |

FOREIGN PATENT DOCUMENTS

JP    7-45829 A    2/1995

OTHER PUBLICATIONS

Non-Final Office Action mailed Sep. 3, 2010 in U.S. Appl. No. 12/184,585 (6 pgs.).

* cited by examiner

*Primary Examiner*—Lynne A Gurley
*Assistant Examiner*—Yosef Gebreyesus
(74) *Attorney, Agent, or Firm*—Brinks Hofer Gilson & Lione

(57) ABSTRACT

Provided is a semiconductor device including an electrostatic discharge (ESD) protection element provided between an external connection terminal and an internal circuit region. In the semiconductor device, interconnect extending from the external connection terminal to the ESD protection element includes a plurality of metal interconnect layers so that a resistance of the interconnect extending from the external connection terminal to the ESD protection element is made smaller than a resistance of interconnect extending from the ESD protection element to an internal element. The interconnect extending from the ESD protection element to the internal element includes metal interconnect layers equal to or smaller in number than the plurality of interconnect layers used in the interconnect extending from the external connection terminal to the ESD protection element.

7 Claims, 2 Drawing Sheets

SEMICONDUCTOR DEVICE

RELATED APPLICATIONS

This application claims priority under 35 U.S.C. §119 to Japanese Patent Application No. JP2007-216583 filed on Aug. 23, 2007, the entire content of which is hereby incorporated by reference.

BACKGROUND OF THE INVENTION

1. Field of the Invention

The present invention relates to a semiconductor device having an electrostatic discharge (ESD) protection element disposed between an external connection terminal and an internal circuit region in order to protect internal elements formed in the internal circuit region from breakdown due to ESD.

2. Description of the Related Art

In a semiconductor device including MOS transistors, an off transistor, which is an NMOS transistor provided in an off-state whose gate potential is fixed to the ground potential (Vss), is used as an ESD protection element for preventing breakdown of an internal circuit due to static electricity supplied from a pad provided for external connection.

In order to avoid the ESD breakdown of the internal elements, it is important to draw a large portion of an electrostatic pulse as much as possible into the off transistor to prevent propagation of the electrostatic pulse to the internal elements, or to change a fast and large electrostatic pulse into a slow and small signal before passing to the internal elements.

Since the off transistor must flow a large amount of current generated by static electricity at once unlike ordinary MOS transistors forming the internal circuit such as a logic circuit, a large width (width W) of about several hundred micrometers is required for the transistor in many cases.

Accordingly, the off transistor often takes a form which is obtained by combining a plurality of drain regions, source regions, and gate electrodes in a comb shape. However, the structure in which a plurality of transistors is combined causes the difficulty in uniformly operating the whole NMOS transistors for ESD protection. For example, current concentration occurs in a portion closer to the external connection terminal, resulting in the breakdown of the off transistor without sufficiently exhibiting the original ESD protection function.

As countermeasures, there is proposed a method in which a distance between a contact hole formed on a drain region and a gate electrode is made smaller to accelerate the operation of the transistor as a distance from the external connection terminal becomes longer (for example, refer to FIG. 2 of JP 7-45829 A).

However, when a width W is made smaller for uniform operation of the off transistor, the protection function is not sufficiently accomplished. Further, in the method of JP 7-45829 A, the distance between the contact and the gate electrode in the drain region is adjusted to thereby locally adjust a transistor operation speed. The method, however, has problems that a desired contact position cannot be ensured along with a reduction in width of the drain region, that interconnect resistance has been made low through interconnect including a refractory metal in recent years to thereby accelerate the propagation speed of surge, which causes a case where the transistor operation speed cannot be adjusted only by the distance between the contact and the gate electrode, and that it is difficult to adapt the method to a case in which interconnect to the transistor is introduced from a direction perpendicular to the width direction of the transistor. Further, in JP 7-45829 A, there is not disclosed a method for drawing a large portion of an electrostatic pulse as much as possible into the off transistor to prevent propagation of the electrostatic pulse to the internal elements, or a method for changing a fast and large electrostatic pulse into a slow and small signal before passing to the internal elements, in order to avoid the ESD breakdown of the internal elements.

SUMMARY OF THE INVENTION

In order to solve the problems described above, a semiconductor device according to the present invention is configured as follows.

The present invention provides a semiconductor device including: an internal element formed in an internal circuit region; an electrostatic discharge protection element formed between an external connection terminal and the internal circuit region in order to protect the internal element from breakdown due to electrostatic discharge; interconnect extending from the external connection terminal to the electrostatic discharge protection element; and interconnect extending from the electrostatic discharge protection element to the internal element, in which a resistance of the interconnect extending from the external connection terminal to the electrostatic discharge protection element is smaller than a resistance of the interconnect extending from the electrostatic discharge protection element to the internal elements.

As described above, according to the present invention, in order to avoid the ESD breakdown of the internal elements, it is possible to draw a large portion of an electrostatic pulse as much as possible into the off transistor to prevent propagation of the electrostatic pulse to the internal elements, or to change a fast and large electrostatic pulse into a slow and small signal before passing to the internal elements. Consequently, a semiconductor device including the ESD protection element which can achieve a sufficient ESD protection function can be attained.

DETAILED DESCRIPTION OF THE PREFERRED EMBODIMENT

First Embodiment

Figure 1:
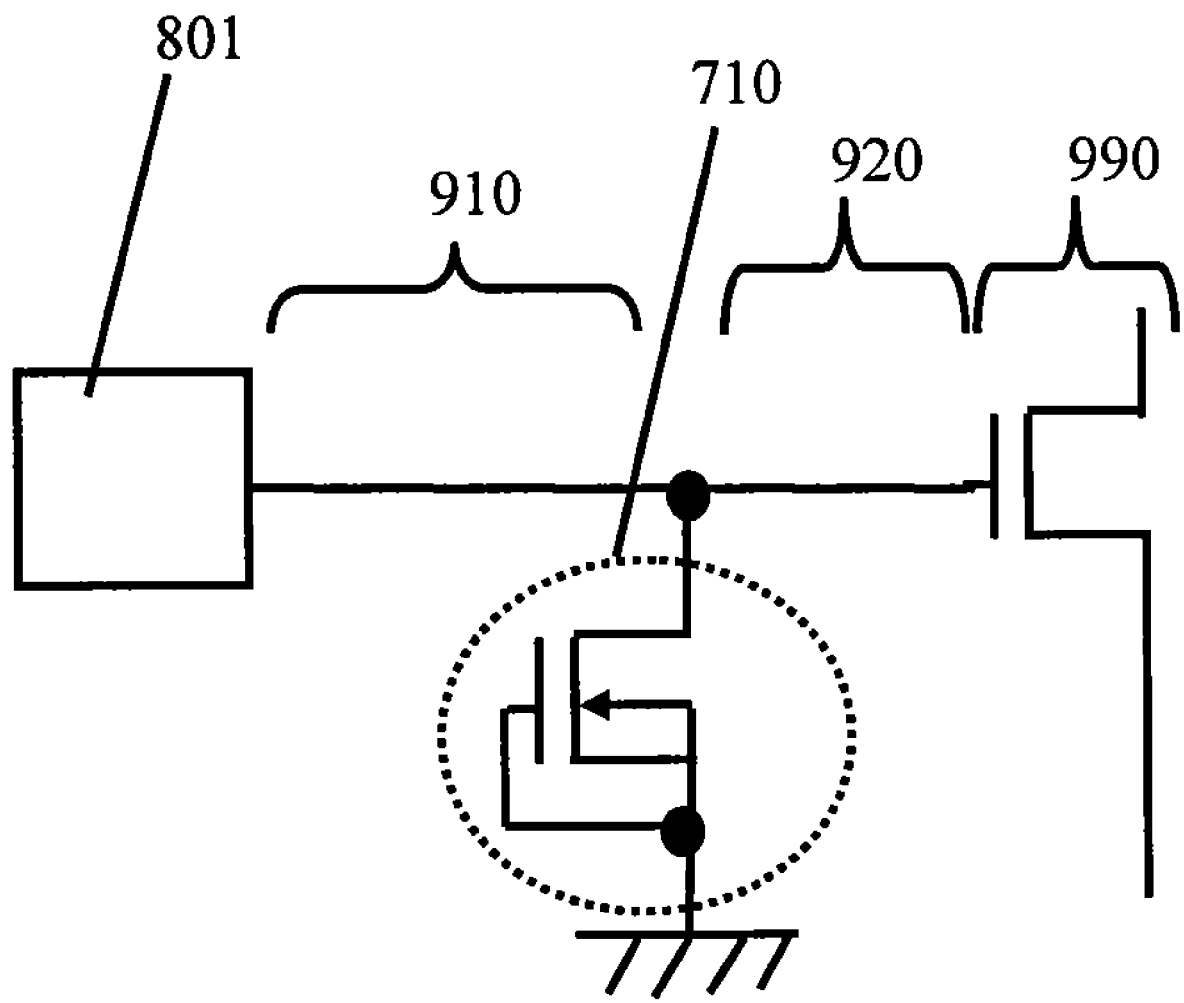
FIG. 1 shows a schematic circuit diagram of a semiconductor device according to the present invention, in which an external connection terminal, an ESD protection element, and an internal element are connected.

FIG. 1 is a schematic circuit diagram of a semiconductor device according to the present invention, in which an external connection terminal, an ESD protection element, and an internal element are connected.

An external connection terminal 801 and a drain region of an NMOS transistor for ESD protection 710 as an ESD protection element are connected to each other via an interconnect region 910 formed between the external connection terminal and the ESD protection element. The NMOS transistor for ESD protection 710 and an internal element 990 are connected to each other via an interconnect region 920 formed between the ESD protection element and the internal element.

Further, a resistance of the interconnect region 910 formed between the external connection terminal and the ESD protection element is configured to be smaller than a resistance of the interconnect region 920 formed between the ESD protection element and the internal element.

Thus, an electrostatic pulse and a surge of the ESD are preferentially drawn into the ESD protection element, and a fast and large electrostatic pulse is not propagated to the internal element as it is but is changed into a slow and small signal before transmission.

FIG. 1 shows an example of a portion of an input terminal, in which there is used an NMOS transistor serving as an ESD protection element with a gate potential thereof fixed to the ground potential, and an internal element which is a MOS transistor with a gate electrode thereof connected to an interconnect from the external connection terminal. Similar effects can be obtained even in the case of an output terminal, in which a drain region of the MOS transistor serving as the internal element is connected to the external connection terminal. Further, even in the case of using a diode or the like as the ESD protection element instead of an NMOS transistor, or in the case of using another element as the internal element in place of the MOS transistor, the resistance of the interconnect region 910 formed between the external connection terminal and the ESD protection element is configured to be smaller than the resistance of the interconnect region 920 formed between the ESD protection element and the internal element, whereby the similar effects can be attained.

Second Embodiment

Figure 2:
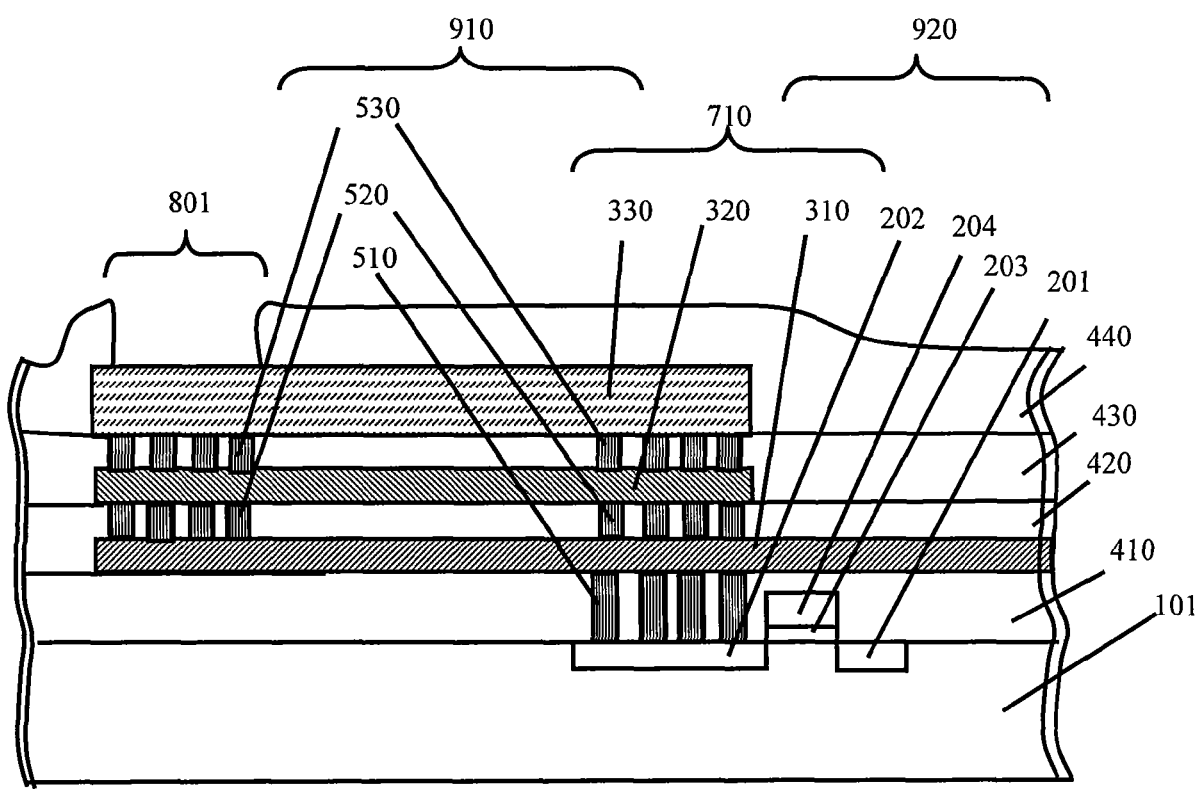
FIG. 2 is a schematic sectional view showing a semiconductor device according to an embodiment of the present invention.

FIG. 2 is a schematic sectional view showing a semiconductor device according to another embodiment of the present invention.

On a p-type silicon substrate 101, a source region 201 and a drain region 202 including n-type heavily doped impurity regions are formed. On the p-type silicon substrate 101 located between the source region 201 and the drain region 202, a gate electrode 204 is arranged via a gate insulating film 203 formed of an insulating film such as a silicon oxide film, whereby the NMOS transistor for ESD protection 710 is formed. Here, the source region 201 and the gate electrode 204 are fixed at the ground potential to take the form of, what is called, an off transistor.

Besides, first metal interconnect 310 formed of aluminum or the like including a refractory metal is formed on the source region 201, the drain region 202, and the gate electrode 204 via a first insulating film 410.

A large number of contact holes 510 are provided on the first insulating film 410 formed on the drain region 202, and electrically connects the first metal interconnect 310 and the drain region 202. Here, the contact holes 510 formed on the drain region 202 are widely distributed to be arranged substantially over the entire surface of the drain region 202. This is because, when the NMOS transistor for ESD protection 710 achieves the function of receiving the ESD surge and releasing current through the bipolar operation, occurrence of the function at one-sided portions is prevented.

Since management of large current is required for the NMOS transistor for ESD protection 710 in order to achieve the protection function, the NMOS transistor for ESD protection 710 is designed to have a large channel width W. However, for example, local arrangement of the contact holes 510 prevents full use of the large channel width, making operations only in partial regions, which leads to breakdown by local concentration of the large current, and thus a desired ESD immunity cannot be exerted.

Wide distribution and arrangement of a large number of the contact holes 510 formed substantially over the entire surface of the drain region 202 enables uniform and whole operation of the NMOS transistor for ESD protection 710 against the incoming electrostatic pulse, permitting effective management (release) of the electrostatic pulse through the entire channel width.

Subsequently, on the first metal interconnect 310 which is formed on a portion located on the drain region 202, the external connection terminal 801 region, and the interconnect region 910 formed between the external connection terminal and the ESD protection element, second metal interconnect 320 formed of aluminum or the like including a refractory metal is formed via a second insulating film 420.

First via-holes 520 are formed in the second insulating film 420 formed on the portion located on the drain region 202 and the external connection terminal 801 region, the second insulating film 420 being formed on the first metal interconnect 310. The first metal interconnect 310 and the second metal interconnect 320 are connected to each other via the first via-holes 520.

Further, a third metal interconnect 330 formed of aluminum or the like including a refractory metal is formed on the second metal interconnect 320 via a third insulating film 430. At the portion located on the drain region 202 and the external connection terminal 801 region, second via-holes 530 are formed in the third insulating film 430 formed on the second metal interconnect 320. The second metal interconnect 320 and the third metal interconnect 330 are connected to each other via the second via-holes 530.

Since the third metal interconnect 330 which becomes metal interconnect of an uppermost layer has a higher margin for a manufacturing process such as etching, compared with the first metal interconnect 310 and the second metal interconnect 320 which become intermediate layers, film thickness can be made greater. Accordingly, the third metal interconnect 330 can be used effectively as interconnect with lower resistance.

The third metal interconnect 330 and the third insulating film 430 are covered with a protection film 440 formed of a silicon nitride film or the like except for the external connection terminal 801 region.

As described above, the first metal interconnect 310, the second metal interconnect 320, and the third metal interconnect 330 are formed on the interconnect region 910 formed between the external connection terminal and the ESD protection element, and on the drain region 202 of the NMOS transistor for ESD protection 710, and connect the external connection terminal 801 and the drain region 202 of the NMOS transistor for ESD protection 710.

In this case, the first metal interconnect 310, the second metal interconnect 320, and the third metal interconnect 330 are formed so as to be laminated in the same pattern when viewed from above. Each of the first metal interconnect 310, the second metal interconnect 320, and the third metal interconnect 330 do not need additional areas and can connect the external connection terminal 801 region and the drain region 202 of the NMOS transistor for ESD protection 710.

As described above, in the interconnect region 910 formed between the external connection terminal and the ESD protection element, lower resistance is attained by making the effective and best use of a plurality of metal interconnect layers.

On the other hand, in the interconnect region 920 formed between the ESD protection element and the internal element, interconnect from the NMOS transistor for ESD protection element 710 to an internal element (not shown) is formed only with the first metal interconnect 310. The interconnect region 920 has a larger resistance than the interconnect region 910 formed between the external connection terminal and the ESD protection element.

As described so far, in the embodiment of the present invention shown in FIG. 2, the resistance of the interconnect region 910 formed between the external connection terminal and the ESD protection element is configured to be smaller than the resistance of the interconnect region 920 formed between the ESD protection element and the internal element. Accordingly, it is possible to preferentially draw surge of the ESD or electrostatic pulses into the ESD protection element and to change fast and large electrostatic pulses into slow and small signals to be transmitted without causing fast and large electrostatic pulses to be diffused to the internal element as they are.

Note that the embodiment of the present invention of FIG. 2 shows an example in which the interconnect region 910 formed between the external connection terminal and the ESD protection element uses three metal interconnect layers for interconnect, and the interconnect region 920 formed between the ESD protection element and the internal element uses one metal layer for interconnect. However, the number of the metal layers is not limited to the number of those layers. The interconnect region 910 formed between the external connection terminal and the ESD protection element may have only to be formed with a plurality of layers of metal interconnect. The interconnect region 920 formed between the ESD protection element and the internal element may have only to be formed with layers of metal interconnect equal to or smaller in number than the plurality of metal interconnect which are used for the interconnect region 910 formed between the external connection terminal and the ESD protection element.

An example in which the p-type silicon substrate 101 is used as a semiconductor substrate has been described, but an n-type silicon substrate may be used instead of the p-type silicon substrate 101, and a p-well region may be provided thereon to form the NMOS transistor for ESD protection 710 in the p-well region.

An example has been described in which the first via-holes 520 connecting the first metal interconnect 310 and the second metal interconnect 320, and the second via-holes 530 connecting the second metal interconnect 320 and the third metal interconnect 330 are arranged only on an upper portion of the drain region 202 of the NMOS transistor for ESD protection 710 and the external connection terminal 801 region. In addition to this, the first via-holes 520 and the second via-holes 530 may be appropriately set in the interconnect region 910 formed between the external connection terminal and the ESD protection element to achieve an electrical connection between the first metal interconnect 310, the second metal interconnect 320, and the third metal interconnect 330.

Further, in the embodiment of the present invention shown in FIGS. 1 and 2, an example has been described in which the metal interconnect of the interconnect region 910 formed between the external connection terminal and the ESD protection element is made as a plurality of layers so as to lower the resistance, and therefore the resistance is made relatively smaller than the resistance of the interconnect region 920 formed between the ESD protection element and the internal element. In the semiconductor including the ESD protection element, in order to make the resistance of the interconnect extending from the external connection terminal to the ESD protection element smaller than the resistance of the interconnect extending from the ESD protection element to the internal element, it is also possible to make the resistance of the interconnect extending from the external connection terminal to the ESD protection element relatively smaller than the resistance of the interconnect extending from the ESD protection element to the internal element by providing additional resistances to the interconnect region 920 formed between the ESD protection element and the internal element, or by making a width of the interconnect of the interconnect region 920 formed between the ESD protection element and the internal element much narrower to increase the resistance of the interconnect region 920 formed between the ESD protection element and the internal element.

As described above, in the semiconductor device according to the present invention, the resistance of the interconnect extending from the external connection terminal to the ESD protection element is configured to be made smaller than the resistance of the interconnect extending from the ESD protection element to the internal element. Thus, electrostatic pulses and surge of the ESD are preferentially drawn into the ESD protection element, and fast and large electrostatic pulses are not caused to be diffused to the internal element as they are but caused to be changed into slow and small signals to be transmitted to the internal element. Accordingly, a semiconductor device including an ESD protection element which can achieve a sufficient ESD protection function can be attained.

What is claimed is:

1. A semiconductor device, comprising:
   an electrostatic discharge protection transistor disposed between an external connection terminal and an internal element and receiving electrostatic discharge surge and releasing a current through a bipolar operation, in order to protect the internal element from breakdown due to electrostatic discharge;
   a first interconnect structure extending from the external connection terminal to the electrostatic discharge protection transistor and comprising a plurality of metal interconnect layers which are electrically coupled to a drain region of the electrostatic discharge protection transistor; and
   a second interconnect structure arranged between the electrostatic discharge protection transistor and the internal element;
   wherein a resistance across the first interconnect structure is smaller than the resistance across the second interconnect structure such that the electrostatic discharge surge is drawn to the electrostatic discharge protection transistor.

2. A semiconductor device according to claim 1, wherein the electrostatic discharge protection transistor comprises an electrostatic discharge protection NMOS transistor in which a gate potential is fixed to a ground potential.

3. A semiconductor device according to claim 1, wherein the drain of the electrostatic discharge protection transistor is coupled to the plurality of metal interconnect layers via multiple contact holes distributed across the entire drain.

4. A semiconductor device according to claim 1, wherein only the first interconnect structure comprises the plurality of metal interconnect layers.

5. A semiconductor device according to claim 1, wherein the first interconnect structure and the second interconnect structure comprise a metal interconnect layer made from a refractory metal.

6. A semiconductor device according to claim 2, wherein the electrostatic discharge protection NMOS transistor comprises a drain region in which the plurality of metal interconnect layers are arranged over an entire surface of the drain region, and the drain region and the plurality of metal interconnect layers are electrically connected to each other via a contact hole and a via-hole.

7. A semiconductor device, comprising:

an electrostatic discharge protection element disposed between an external connection terminal and an internal element in order to protect the internal element from breakdown due to electrostatic discharge;

a first interconnect structure extending from the external connection terminal to the electrostatic discharge protection element; and a second interconnect structure extending from the electrostatic discharge protection element to the internal element;

wherein the first interconnect structure shares at least one metal layer with the second interconnect structure;

wherein a resistance across the first interconnect structure is smaller than the resistance across the second interconnect structure such that the electrostatic discharge surge is drawn to the electrostatic discharge protection element.

* * * * *